United States Patent
Lee et al.

(10) Patent No.: US 12,426,407 B2
(45) Date of Patent: Sep. 23, 2025

(54) METHOD OF MANUFACTURING A FLUORESCENT SUBSTANCE

(71) Applicant: ROOTS Co., Ltd., Incheon (KR)

(72) Inventors: Sung Yoon Lee, Incheon (KR); Soon Min Kim, Incheon (KR); Jong Woo Ha, Seoul (KR)

(73) Assignee: ROOTS Co., Ltd., Incheon (KR)

( * ) Notice: Subject to any disclaimer, the term of this patent is extended or adjusted under 35 U.S.C. 154(b) by 126 days.

(21) Appl. No.: 18/199,988

(22) Filed: May 22, 2023

(65) Prior Publication Data

US 2023/0381993 A1 Nov. 30, 2023

(30) Foreign Application Priority Data

May 24, 2022 (KR) .................. 10-2022-0063270

(51) Int. Cl.
*H10H 20/01* (2025.01)
*H10H 20/851* (2025.01)
*H10H 29/01* (2025.01)
*H10H 29/851* (2025.01)
*B26D 11/00* (2006.01)

(52) U.S. Cl.
CPC .... *H10H 20/0361* (2025.01); *H10H 20/8514* (2025.01); *H10H 29/0361* (2025.01); *H10H 29/8514* (2025.01); *B26D 2011/005* (2013.01); *H10H 20/851* (2025.01)

(58) Field of Classification Search
CPC ........... H01H 20/0361; H01H 20/8514; H01H 29/0361; H01H 29/8514; H01L 21/78
See application file for complete search history.

(56) References Cited

U.S. PATENT DOCUMENTS

| | | | |
|---|---|---|---|
| 6,756,288 B1 * | 6/2004 | Feil | H01L 21/6836 257/E21.705 |
| 8,330,182 B2 * | 12/2012 | Suenaga | H10H 20/851 257/E33.059 |
| 8,476,661 B2 * | 7/2013 | Kim | H10H 20/8514 257/98 |
| 8,648,375 B2 * | 2/2014 | Furuyama | H10H 20/8514 257/E33.068 |
| 9,530,546 B2 * | 12/2016 | Nukaga | H01F 27/402 |
| 9,893,246 B2 * | 2/2018 | Matsuda | H10H 20/8514 |
| 10,825,964 B2 * | 11/2020 | Harada | H10H 20/8514 |
| 10,957,821 B2 * | 3/2021 | Vampola | H10H 20/8514 |
| 11,563,145 B2 * | 1/2023 | Noma | H10H 20/8514 |
| 11,679,527 B2 * | 6/2023 | Lee | H10H 20/8515 451/41 |
| 2002/0055238 A1 * | 5/2002 | Sugino | H01L 24/29 438/464 |
| 2015/0069576 A1 * | 3/2015 | Mariani | H01L 21/78 438/460 |

* cited by examiner

*Primary Examiner* — David A Zarneke
(74) *Attorney, Agent, or Firm* — Revolution IP, PLLC

(57) ABSTRACT

A method of manufacturing a fluorescent substance includes forming dicing trenches on one surface of a fluorescent substance wafer along lattice-shaped dicing lines, and a lower surface grinding operation (S6) of grinding a surface opposite to a surface of the wafer in which the dicing trenches are formed as much as a predetermined thickness using a disk-shaped grinder so that the wafer is divided into a plurality of fluorescent substances, which are color conversion members for light emitting diodes (LEDs).

9 Claims, 16 Drawing Sheets

METHOD OF MANUFACTURING A FLUORESCENT SUBSTANCE

CROSS-REFERENCE TO RELATED APPLICATION

This application claims priority to and the benefit of Korean Patent Application No. 10-2022-0063270, filed on May 24, 2022, the disclosure of which is incorporated herein by reference in its entirety.

BACKGROUND

1. Field of the Invention

The present disclosure relates to a method of manufacturing a fluorescent substance. More specifically, the present disclosure relates to a method of manufacturing a fluorescent substance as a color conversion member for changing a wavelength of light emitted from a light emitting diode (LED) chip.

2. Discussion of Related Art

Korean Patent No. 2243674 discloses a process of manufacturing a color conversion member in the form of a thin and wide wafer and then dividing the wafer into several small fluorescent substances as a post-processing process. During the process of dividing the wafer into very small fluorescent substances, that is, in a dicing or grinding process or the like, there is a possibility that the wafer may be damaged or some small fluorescent substance chips are away from a workbench.

In particular, when a dicing blade 45 shown in FIG. 14 is applied to a process of directly dividing a wafer 41, this problem may appear even more significantly. During operation, the wafer 41 is placed on a disk-shaped ultraviolet (UV) tape 49. A bonding material is applied to an upper surface of the UV tape 49 so that the wafer 41 can be fixed. The wafer 41 having a thickness of about 1.5 mm is first ground to have a thickness of 0.1 to 0.2 mm and then cut into a lattice shape by the dicing blade 45. Phosphor particles of the wafer 41 are chipped and the wafer 41 is cut by the dicing blade 45, and in this process, a chipping phenomenon that a side surface of the fluorescent substance 42 is unevenly chipped occurs. In addition, the fluorescent substance 42 may not overcome a rotating force of the dicing blade 45 and may be flown away from an attachment surface of the UV tape 49. The smaller the size of the fluorescent substance 42, the smaller the contact surface with the UV tape 49, and thus a bonding force is lowered. Since the bonding force is small, the fluorescent substance 42 may not overcome the rotating force when the fluorescent substance 42 is rub against the dicing blade 45, thereby flown outward. Also as shown in FIG. 13, cracks can occur.

Korean Patent No. 1644149 discloses a multi-chip light emitting diode (LED) package. Efforts are being made to densely arrange multiple LEDs and apply it to headlights for vehicles or projectors. These application products require the miniaturization of LEDs so that more LEDs may be densely installed in a limited space. However, the smaller the LED, the smaller the fluorescent substance, and when the fluorescent substance becomes smaller, cracking and chipping phenomena increase in the process of manufacturing a fluorescent substance, and the phenomenon that the fluorescent substance is flown away in the process of dividing the wafer increases.

LEDs used in multi-chip LED packages need to have high straightness of emitted light in order to minimize the interference between beams emitted from the multiple LEDs. Also, in order to improve light quality, it is necessary to use a smooth and compact fluorescent substance without cracks or chipping.

SUMMARY OF THE INVENTION

The present disclosure is directed to providing a method of manufacturing a fluorescent substance capable of providing a smooth and small fluorescent substance having high straightness of light without cracks or chipping, thereby improving the light quality of a light emitting diode (LED).

A method of manufacturing a fluorescent substance according to the present disclosure includes forming dicing trenches on one surface of a fluorescent substance wafer along lattice-shaped dicing lines, and a lower surface grinding operation (S6) of grinding a surface opposite to a surface of the wafer in which the dicing trenches are formed as much as a predetermined thickness using a disk-shaped grinder so that the wafer is divided into a plurality of fluorescent substances, which are color conversion members for LEDs, wherein the forming of the dicing trenches (S2, S3) includes a primary cutting operation (S2) of forming a side surface of each of the dicing trenches to be inclined and reduced in width inward using a bevel-type dicing blade whose width is reduced outward, and a secondary cutting operation (S3) of additionally forming a deeper dicing trench in a bottom surface of each of the dicing trenches formed by the primary cutting operation using a dicing blade having a planar surface with a uniform width.

The method may further include grinding the surface, on which the dicing trenches are formed, as much as a uniform thickness to remove a chipping portion formed on the surface of the wafer in the forming of the dicing trenches (S2, S3).

A width of an outermost portion of the bevel-type dicing blade used for the primary cutting (S2) and a width of the planar dicing blade used for the secondary cutting (S3) may be the same, and the dicing trench may be formed to be inclined to have a gradually smaller width from the surface of the wafer to a predetermined depth and formed to have a uniform width to a next predetermined depth.

The method may further include filling a bonding material having fluidity in the dicing trench formed in the primary cutting operation (S2) and the secondary cutting operation (S3), and hardening the bonding material, wherein the lower surface grinding operation (S6) may be an operation of reducing a thickness of a surface opposite to the surface in which the dicing trenches are formed so that a plurality of individual fluorescent substances divided along the dicing lines and the bonding material connecting the plurality of individual fluorescent substances are integrated, and the method may further include removing the bonding material (S7) so that only the divided individual fluorescent substances remain.

The bonding material may be a wax, in the filling of the bonding material, the dicing trenches may be filled with the wax heated to have fluidity, in the hardening, the wax may be placed at room temperature for a predetermined time, and in the removing of the bonding material, the bonding material may be melted by applying a solvent to the bonding material.

The bonding material may be an ultraviolet (UV) curable bonding material, and in the hardening operation, UV rays may be applied to the bonding material.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
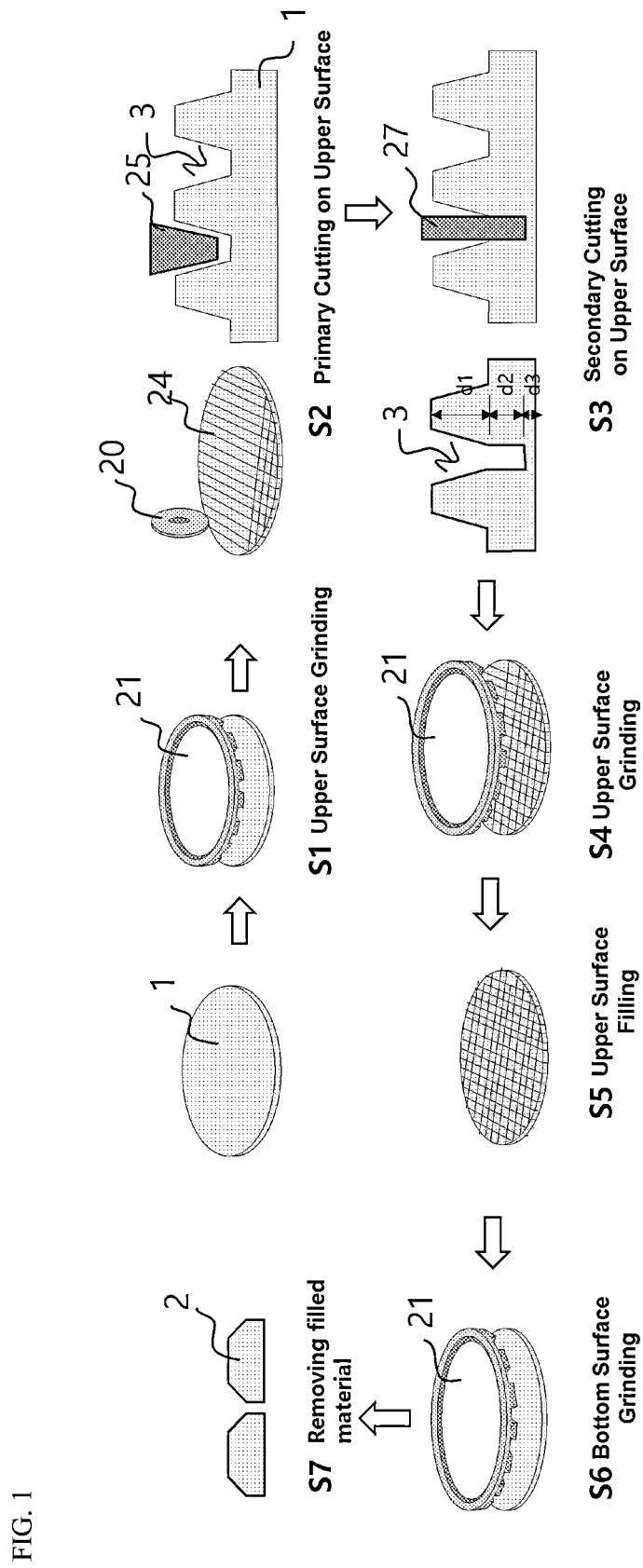
FIG. 1 shows all processes in a method of manufacturing a fluorescent substance according to one embodiment of the present disclosure.

Hereinafter, embodiments of the present disclosure will be described with reference to the accompanying drawings. The accompanying drawings show exemplary forms of the present disclosure, which are only provided to describe the present disclosure in more detail, and the technical scope of the present disclosure is not limited thereto.

In addition, regardless of reference numerals, the same or corresponding components are given the same reference numerals, and overlapping description thereof will be omitted, and for convenience of description, the sizes and shapes of each component member shown may be exaggerated or reduced.

Meanwhile, terms including ordinal numbers, such as first, second, etc., may be used to describe various components, but the components are not limited by the terms, and the terms are only used for the purpose of distinguishing one component from another.

According to a method of manufacturing a fluorescent substance according to an embodiment of the present disclosure, as shown in FIG. 1, a wafer 1 to be divided into individual fluorescent substances 2 is first prepared. The wafer 1 may be manufactured in a circular or quadrangular shape. Manufacturing small chip-shaped fluorescent substances 2 by manufacturing and dividing the wide wafer 1 is more efficient than manufacturing small fluorescent substances 2 having an actual product size from the beginning. The above method is used because a size of the normally used fluorescent substance 2 is relatively small to process manually or by a machine. The wafer 1 can be obtained by mixing powdered fluorescent material with glass crystals, silicone resin, or the like and then applying processes, such as sintering, compression, and drying, to the mixture.

Since the wafer 1 is not of a size to be applied to an actual product, the wafer 1 needs to be divided into the small fluorescent substances 2. In addition, since a surface of the wafer 1 may also be rough and curved, a planarization operation needs to be performed.

Figure 2:
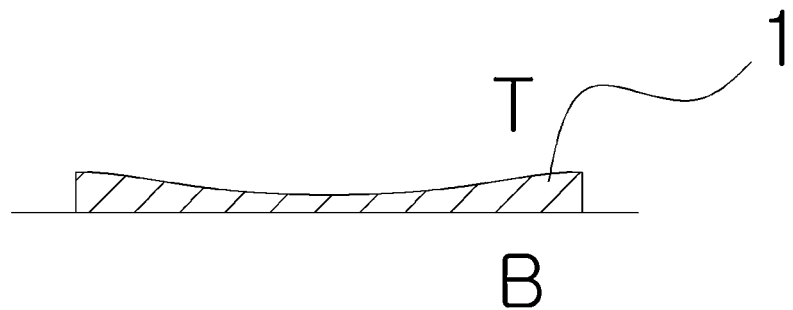
FIG. 2 is a cross-sectional view showing a fluorescent substance wafer used in the method of manufacturing a fluorescent substance according to one embodiment of the present disclosure.

As shown in FIGS. 1 and 2, in operation 51, an upper surface of the wafer is ground. In the wafer 1 manufactured as shown in FIG. 2, a bottom surface B is flat, but a top surface T may be uneven or inclined. Generally, a middle portion of the wafer 1 is thin and an outer portion thereof is thick so that the top surface T has a curved shape. In operation 51, when the top surface T is ground by a grinder 21, the flat top surface T can be obtained. When the top surface T slightly has an uneven portion, that is, when surface roughness does not reach a desired level, the wafer 1 may also be smoothed by repeating a fine grinding operation.

The grinding operation may be performed by the surface grinder 21. The grinder 21 cuts the surface of the wafer 1 using a wide disk being rotated. A thickness of the wafer 1 is uniformly and gradually reduced by the grinding operation. A grinding system may be constructed as a mechanical apparatus including a support for movably supporting the grinder 21, a support bed on which the wafer 1 is placed, and a controller.

Next, in operations S2 and S3, dicing trenches 3 are formed in the wafer 1. A lattice shape is formed by forming a plurality of dicing trenches 3 at regular intervals in a straight line along dicing lines 24 using the dicing blade 20 and forming the plurality of dicing trenches 3 perpendicular to the straight line. The dicing trench 3 may be formed by cutting the wafer 1 only to a predetermined depth without completely dividing the wafer 1. The wafer 1 is convexly formed between the dicing trenches 3, which becomes a portion on which the individual fluorescent substances 2 are formed in the future.

Figure 3:
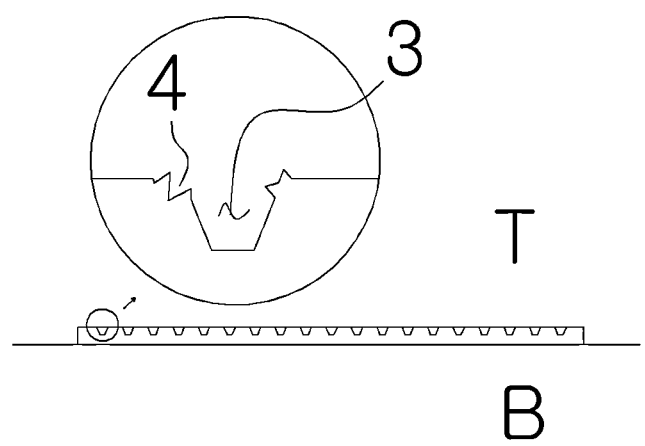
FIG. 3 shows a result of a primary cutting process in the method of manufacturing a fluorescent substance according to one embodiment of the present disclosure.
Figure 11:
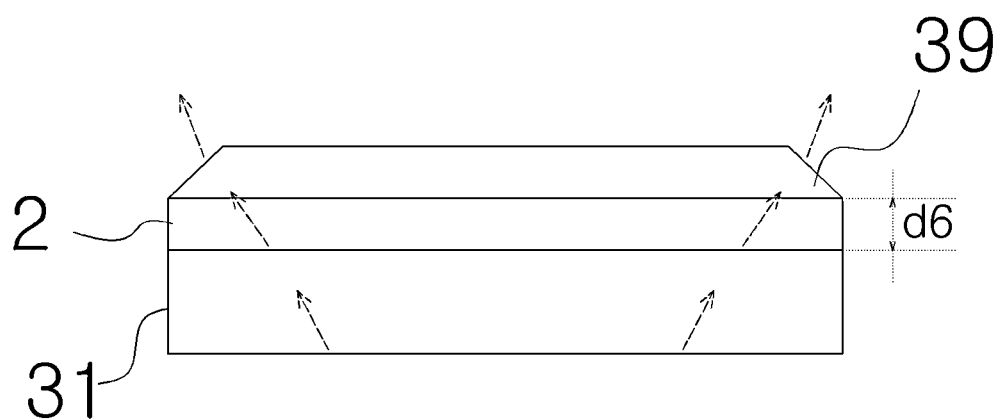

In operation S2, a bevel-type dicing blade 25 whose width is gradually reduced outward may be used. Accordingly, as shown in FIGS. 1 and 3, a width of the dicing trench 3 gradually increases outward. When the bevel-type dicing blade 25 is adopted, as shown in FIG. 11, an inclined surface 39 may be formed on the fluorescent substance 2 to be finally manufactured.

Figure 4:
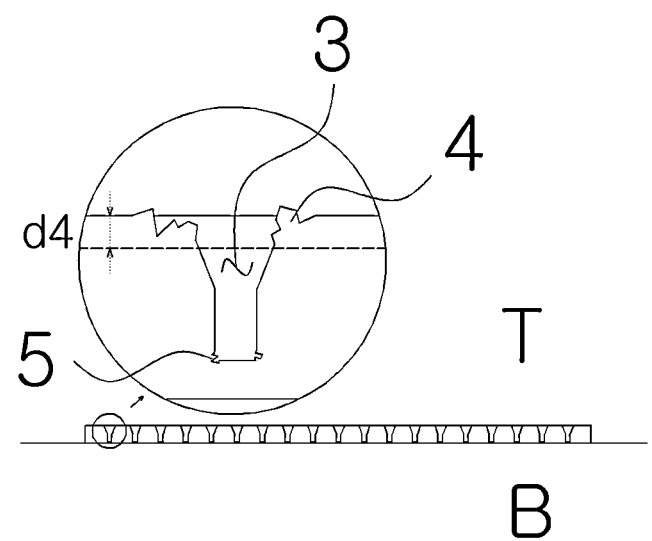
FIG. 4 shows a result of a secondary cutting process in the method of manufacturing a fluorescent substance according to one embodiment of the present disclosure.

In operation S3, a bottom surface of the dicing trench 3 formed in operation S2 is cut once again. At this time, a dicing blade 27 for forming a planar surface is used without using the bevel-type dicing blade 25 for allowing the side surface to be formed to be inclined. The bevel-type dicing blade 25 used in the primary cutting has the smallest outermost width. A dicing blade 27 having a width slightly greater than or equal to the width may be used in the secondary cutting. As shown in FIGS. 1 and 4, the dicing trench 3 is completed after the primary cutting and the secondary cutting in operations S2 and S3 are performed.

The dicing trench 3 is formed by the primary cutting to a predetermined depth d1, and then formed by the secondary cutting to a next depth d2. The bottom surface of the dicing trench 3 is spaced a predetermined thickness d3 from the bottom surface of the wafer 1. The portion formed by the primary cutting is formed to be inclined so that the width is gradually reduced, and a width thereunder is uniformly formed.

As shown in FIGS. 3 and 4, in operations S2, S3 a chipping portion is formed as the dicing trench 3 is formed. In the process of cutting the wafer 1 using the dicing blade 20, the surface of the wafer 1 is unsmoothly chipped. The wafer 1 is manufactured by mixing several particles. Accordingly, in the process of cutting the surface of the wafer 1 using the dicing blade 20, materials constituting the wafer 1 are chipped to form the dicing trench 3, but at the same time, a chipping phenomenon occurs. Typically, the chipping phenomenon occurs mainly at the corner of the dicing trench 3. As shown in FIG. 4, an upper chipping portion 4 may be formed on the widest outer edge of an upper end of the dicing trench 3, and a lower chipping portion 5 may be formed on a lower end of the dicing trench 3. When light emitting diodes (LEDs) are turned on in a state in which the fluorescent substance 2 is mounted on an LED chip 31, light may be scattered through the chipping portion and heat may be concentrated. Accordingly, it is preferable to remove the chipping portion.

Figure 5:
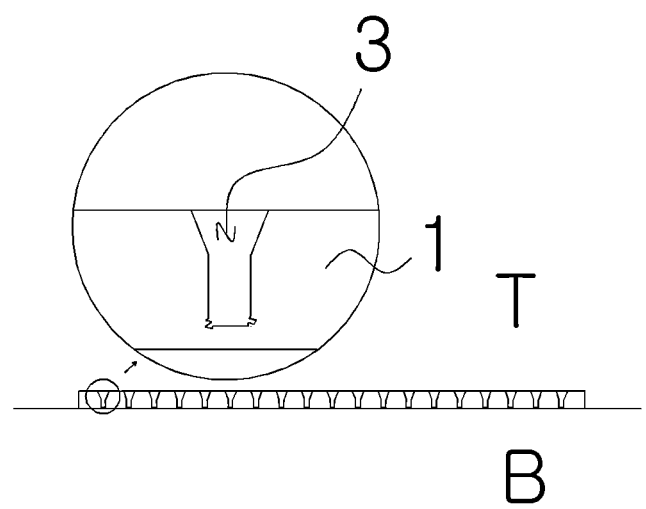
FIG. 5 shows a result of a process of grinding an upper surface in the method of manufacturing a fluorescent substance according to one embodiment of the present disclosure.

Referring to FIGS. 1, 4, and 5, in operation S4, the top surface T of the wafer 1 on which the dicing trenches 3 are formed is ground by the surface grinder 21. This allows the thickness of the wafer 1 to be uniformly reduced. The upper chipping portion 4 may be removed by grinding in operation S4. Since the grinding is performed for the purpose of removing the chipping portion, the grinding is performed only to a predetermined depth d4 from the surface as shown in FIG. 4 so that the inclined surface formed in the first cutting S2 is not completely removed. Accordingly, as shown in FIG. 5, the upper chipping portion 4 may be removed. The lower chipping portion 5 still remains.

Figure 6:
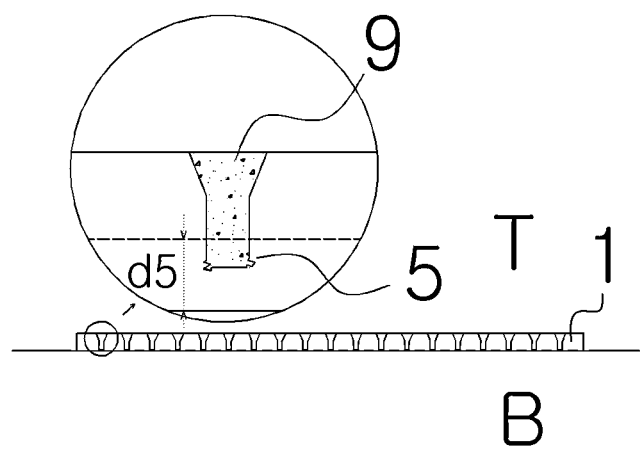
FIG. 6 shows a result of a process of filling the upper surface in the method of manufacturing a fluorescent substance according to one embodiment of the present disclosure.

As shown in FIGS. 1 and 6, the dicing trench 3 is filled with a bonding material 9 in operation S5. In the following operations, the wafer 1 is supported by the bonding material 9 filled inside of the dicing trench 3 until the individual fluorescent substances 2 in the form of small chips are completely separated. As the bonding material 9, a wax, an ultraviolet (UV) curable adhesive, or the like may be applied.

Waxes are substances that have a certain degree of viscosity and fluidity at a relatively high temperature and harden and solidify when exposed to a relatively low temperature for a predetermined time or longer. In the embodiment, operation S5 is performed by applying heat to a wax to reach a predetermined temperature and fluidize the wax, then coating the dicing trench 3 with the wax to fill the dicing trench 3, and then maintaining the wax at room temperature. When the heated wax having high fluidity is applied to the dicing trench 3 and the surface of the wax is ground by a scraper, the surface of the wax may be planarized like the surface of the wafer 1 as shown in FIG. 6.

After a time at room temperature elapses, the wax hardens. The hardened wax inside the dicing trench 3 connects the lattice-shaped convex portions to be divided into the individual fluorescent substance 2 chips in the future. Accordingly, the convex portions may be connected through the bonding material 9.

A UV curable bonding material is a material that normally has fluidity and is cured when exposed to UV rays. When the UV curable bonding material is applied to the dicing trench 3 at room temperature and irradiated with the UV rays, the UV curable bonding material is cured. Like the wax, the UV curable bonding material may be planarized using the scraper, and the cured UV curable bonding material connects the lattice-shaped convex portions to be divided into the individual fluorescent substance 2 chips in the future. Since the curing process is accelerated by radiating the UV rays rather than being left at room temperature like the wax, it is possible to reduce the time required to cure the bonding material 9 and achieve uniformity for each process.

Meanwhile, paraffin may also be used as the bonding material 9 or a synthetic resin, such as acrylic resin, may also be used.

In operation S5, the dicing trench 3 is filled with the bonding material 9 and hardened to reinforce the overall stiffness of the wafer 1 and connect the portions to be divided into the individual fluorescent substances 2 in the future.

Figure 7:
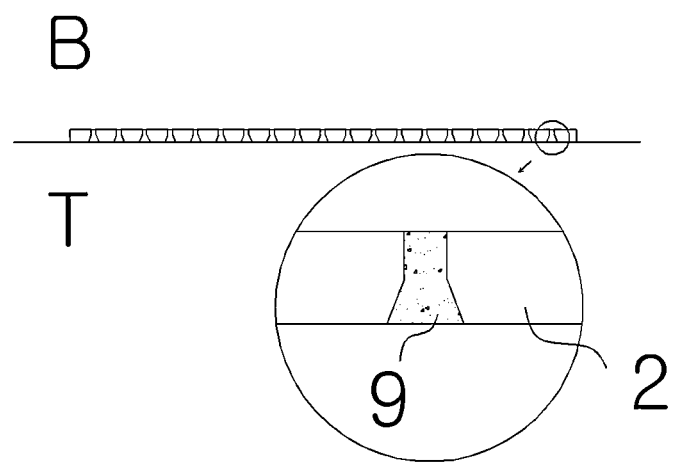
FIGS. 7 and 8 show a result of a process of grinding a lower surface in the method of manufacturing a fluorescent substance according to one embodiment of the present disclosure.

As shown in FIGS. 1, 6, and 7, in operation S6, the wafer 1 is turned over and the grinding operation is performed on a lower surface in which the dicing trenches 3 are not formed. The thickness of the wafer 1 is gradually reduced by performing the grinding operation on a surface opposite to the surface in which the dicing trenches 3 filled with the bonding material 9 are formed. The wafer 1 is turned over so that the portion to which the bonding material 9 is applied faces downward, and the surface thereof is ground by the surface grinder 21. Rough grinding is performed so that the thickness of the wafer 1 is reduced. This process may be performed by gradually moving the surface grinder 21 down toward the work table so that the surface of the surface grinder 21 gradually grinds the lower surface of the wafer. As shown in FIG. 6, the lower chipping portions 5 are formed at both sides of the lower surface of the dicing trench, and this portion is removed as much as the predetermined thickness d5 so that the portion may be completely removed. Accordingly, a lower portion of the bonding material 9 may also be removed. The grinding thickness of the lower surface may be adjusted so that the thickness of the wafer 1 becomes the final required thickness.

Figure 8:
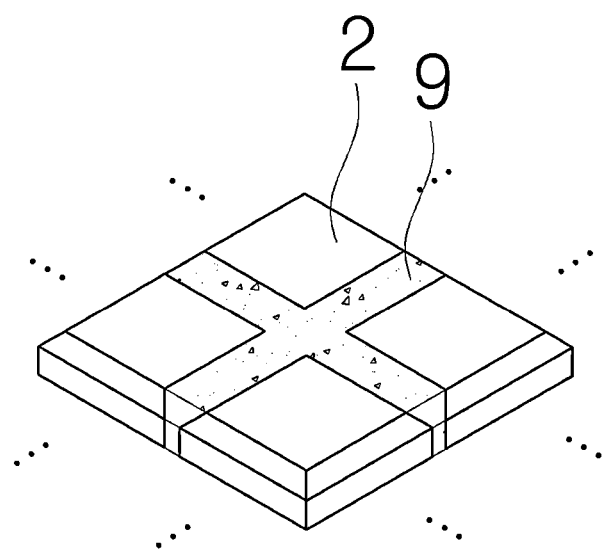

In operation S6, when one surface of the wafer 1 is ground to reduce the thickness, as shown in FIGS. 7 and 8, the wafer 1 finally becomes a state in which the bonding material 9 fills between the plurality of fluorescent substances 2 and connects the plurality of fluorescent substances 2. That is, the wafer 1 is in a state of being already divided into the plurality of fluorescent substances 2 and becomes a state in which the bonding material 9 connects the divided fluorescent substances 2, that is, a state in which the plurality of fluorescent substance 2 chips are embedded between the bonding materials 9 in a row.

Although a force is laterally applied to the fluorescent substances 2 by the rotating force of the grinder 21, since the bonding material 9 supports the fluorescent substances 2, the fluorescent substances 2 may maintain the shapes without being separated from the row. No matter how small the size of the fluorescent substance 2 is, a result that the fluorescent substance 2 is separated does not occur. In addition, when there is no bonding material 9, the positions of the fluorescent substances 2 may be changed, and the positions of fluorescent substances 2 can be varied for each fluorescent substances, and thus the grinding can be non-uniformly performed, but in this embodiment, the fluorescent substance 2 and the bonding material 9 are attached as one body, thereby not causing such a problem.

Finally, as shown in FIG. 1, the bonding material 9 interposed between the fluorescent substances 2 is removed in operation S7.

If the bonding material 9 is a wax, the wax may be removed when a solvent, such as alcohol, is sprayed on the portion on which the wax is formed. When alcohol is sprayed uniformly over the wafer 1, the fluorescent substance 2 is separated into individual chips after a while. When paraffin or acrylic resin is used as the bonding material 9, isopropyl alcohol may be used as a solvent.

If the bonding material 9 is a UV curable bonding material, UV rays may be radiated to remove the UV curable bonding material. As described above, the UV rays are radiated to cure the bonding material 9, and when the UV rays are radiated once more in operation S7, the bonding material 9 is further cured and separated from the fluorescent substance 2. When the work table is a UV tape, the bonding material 9 may be removed together when the tape is removed by UV.

Since the solvent or UV application method as described above is used rather than the physically removing method by force, it is possible to prevent damage to the fluorescent substance 2 compared to the case in which the bonding material 9 is physically removed from the fluorescent substance 2. In addition, it is also possible to prevent a part of the bonding material 9 remaining on the side surface of the fluorescent substance 2 and being stained or non-uniformly formed on the side surface portion of the fluorescent substance 2.

Through the above-described process, it is also possible to manufacture the small fluorescent substance 2 to have a smooth shape. That is, the chipping portions 4 and 5 on the surface of the wafer 1 formed when the dicing trench 3 is formed may be removed in operations S4 and S6, after chipping portions 4 and 5 are removed and then the smooth dicing trenches 3 are filled with the bonding material 9 in operation S5, the grinding was performed to the fluorescent substance 2 and the bonding material 9 which were integrally formed together, thereby the wafer 1 is divided into the individual fluorescent substances 2, thereby preventing the separation of the fluorescent substance 2 and deformation of the shape of the fluorescent substance 2 in operation S6, and only the bonding material 9 can be removed without damaging or deforming the fluorescent substance 2 in operation S7. Generally, it is difficult to manufacture a fluorescent substance having a square shape of 1 mm by 1 mm or less, but it is also possible to manufacture a fluorescent substance having a size of 0.75 micrometers or less by using the bonding material 9. It is possible to manufacture a fluorescent substance as small as 0.45 micrometers by micrometers.

Figure 9:
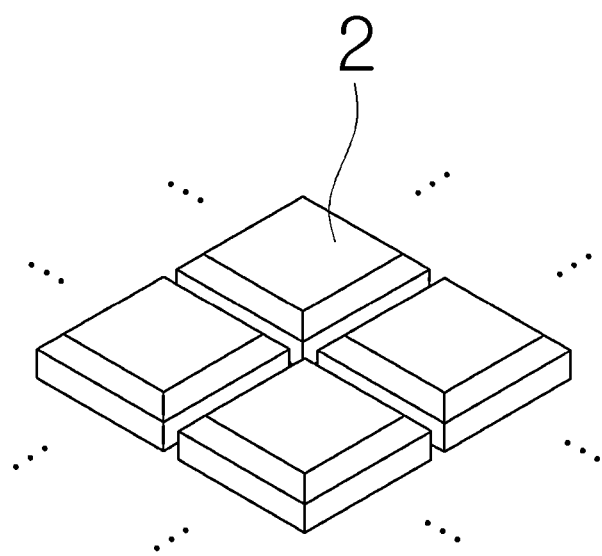
FIG. 9 is a perspective view showing a decahedral fluorescent substance made by the method of manufacturing a fluorescent substance according to one embodiment of the present disclosure.
Figure 10:
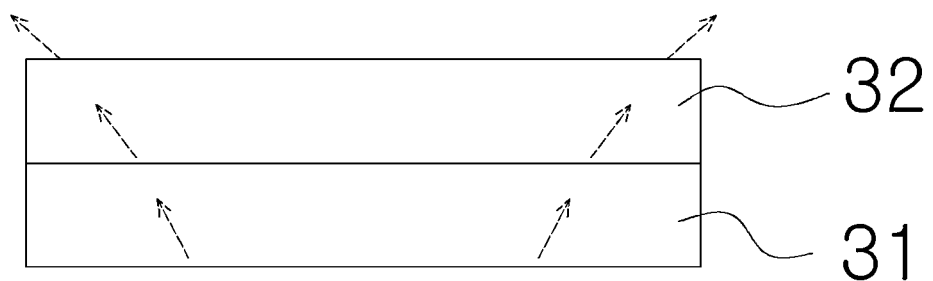
FIGS. 10 and 11 are conceptual diagrams showing light paths of fluorescent substances according to a first comparative example and one embodiment of the present disclosure.
Figure 12:
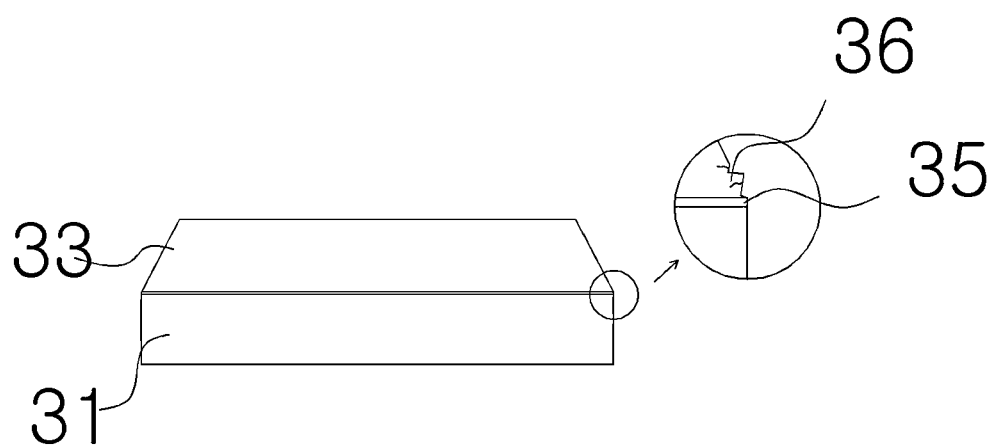
FIG. 12 is a front view showing a light emitting diode (LED) chip equipped with a fluorescent substance according to a second comparative example.
Figure 13:
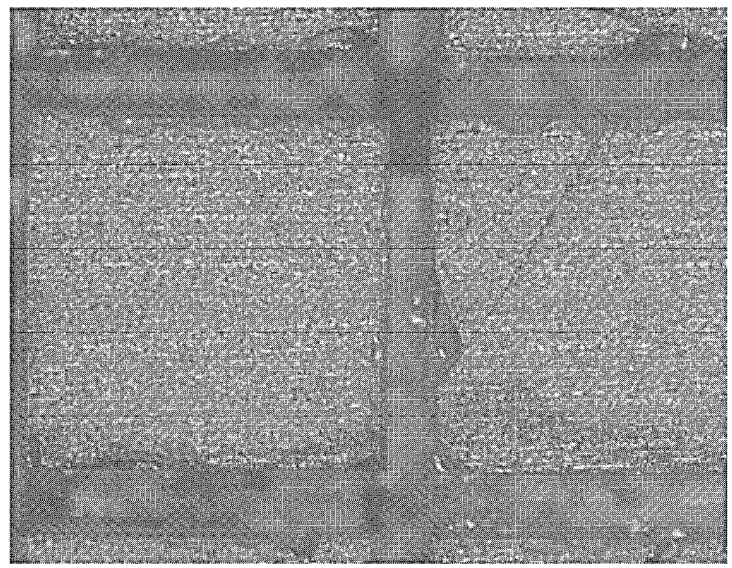
FIG. 13 is a photograph showing a fluorescent substance manufactured according to the related art.
Figure 14:
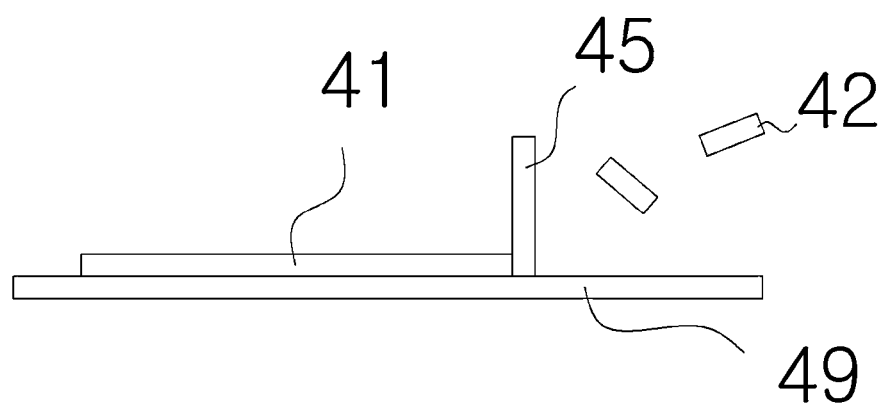
FIG. 14 is a conceptual diagram showing a situation in which fluorescent substances are flown when the fluorescent substance is manufactured according to the related art.

According to the method of manufacturing a fluorescent substance according to the embodiment of the present disclosure, as shown in FIG. 9, decahedral fluorescent substances 2 may be manufactured. Generally, a fluorescent substance is formed in a hexahedron. The fluorescent substance may be formed as a rectangular fluorescent substance 32 as shown in FIG. 10 or formed as a hexahedron fluorescent substance 33 with four inclined sides as shown in FIG. 12. The hexahedron fluorescent substance 33 in FIG. 12 will have a trapezoidal cross section.

As shown in FIG. 10, the fluorescent substance 32 installed on the LED chip 31 converts a wavelength of light emitted from the LED chip 31. However, since the rectangular fluorescent substance 32 emits light without concentration, the light spreads out. FIG. 11 shows a form in which the decahedral fluorescent substance 2 manufactured according to the method of manufacturing a fluorescent substance according to the embodiment of the present disclosure is installed on the LED chip 31. As shown in FIG. 11, since an inclined surface 39 is formed at the side of the fluorescent substance 2, an optical path proceeding to this portion is changed. That is, an angle at which the light exits the inclined surface 39 is directed to the center of the fluorescent substance. Accordingly, it is possible to improve the straightness of light compared to the rectangular fluorescent substance 32 in FIG. 10.

It is also possible to improve the straightness of the light in the hexahedron fluorescent substance 33 having the inclined side surface shown in FIG. 12. However, the inclined hexahedron fluorescent substance 33 may cause a problem because a thickness thereof is gradually smaller outward. A thickness of the outermost portion of the inclined hexahedron fluorescent substance 33 converges to zero. As shown in FIG. 11, the decahedral fluorescent substance 2 manufactured according to the embodiment of the present disclosure is different from the hexahedron fluorescent substance 33 in that a thickness d6 of the outermost portion is not zero.

As shown in FIG. 12, when the inclined hexahedron fluorescent substance 33 is mounted on the LED chip 31, high heat may be generated at the outermost portion thereof. When the amount of light emitted from the LED chip 31 is constant over the entire area, the thin portion of the fluorescent substance 33 needs to pass the same amount of light as the thick center portion thereof. When the LED chip 31 is driven, energy may be concentrated on the thin portion of the outer portion of the fluorescent substance 33 thereof and overheated.

In addition, the chipping portion 36 may be formed at the outermost portion of the fluorescent substance 33 in the manufacturing process, and in this case, the temperature during driving of the LED may further increase. This is because light may not properly pass through the chipping portion 36 and is scattered and thus heat energy is accumulated. The chipping portion 36 may be formed when cutting is performed using the dicing blade or may also be formed in the processing of transporting the fluorescent substance 33 even when not present during cutting. The process of mounting the fluorescent substance 33 on the LED chip 31 is called pick-and-place, and when this process proceeds quickly, the fluorescent substance 33 may be damaged due to impact when placed on the LED chip 31. At this time, the thin outermost portion is the most vulnerable.

When the outermost portion of the fluorescent substance 33 is overheated, both light quality and durability are adversely affected. Generally, as shown in FIG. 12, the LED chip 31 and the fluorescent substance 33 are fixed by an adhesive layer and the adhesive layer 35 may be melted or denatured by heat. According to the embodiment of the present disclosure, it is possible to manufacture the decahedral fluorescent substance 2 having the smooth surface, which is superior to the fluorescent substances 32 and 33 according to the comparative examples in terms of light quality and durability. This is because the straightness of light is excellent since the outermost portion also has the predetermined thickness d6 and has no chipped portion and also the fluorescent substance 2 is superior in terms of durability since the inclined surfaces 39 are formed. In addition, it is also possible to miniaturize the fluorescent substance 2. Accordingly, a plurality of LED chips 31 may be densely arranged.

Figure 15:
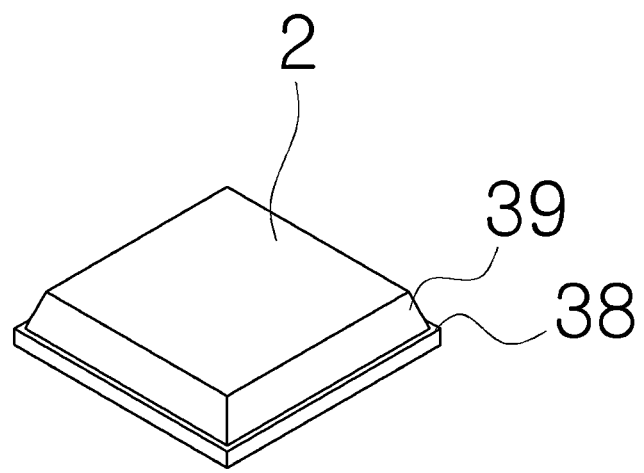
FIGS. 15 and 16 are a perspective view and a front view showing a fluorescent substance manufactured by a method of manufacturing a fluorescent substance according to another embodiment of the present disclosure.
Figure 16:
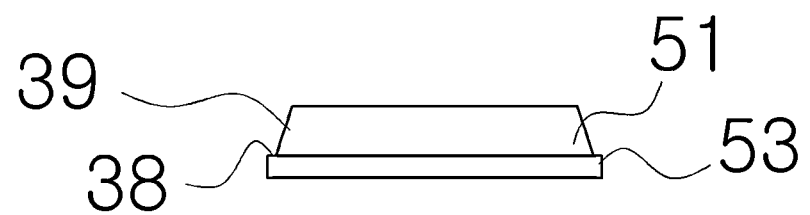

Meanwhile, FIGS. 15 and 16 show a fluorescent substance manufactured according to another embodiment of the present disclosure. In the previous embodiment, in the secondary cutting process of the upper surface (S3), the secondary cutting is performed using the dicing blade 27 having a width that is the same as or slightly greater than the width of the outermost portion of the bevel-type dicing blade 25 used for the primary cutting. Accordingly, the decahedral fluorescent substance 2 can be obtained.

In another embodiment, the secondary cutting can be performed using a dicing blade 27 having a width smaller than a minimum width of the dicing blade 25 used for the primary cutting. In this case, as shown in FIGS. 15 and 16, both the inclined surface 39 and a horizontal surface 38 can be formed at the outermost portion of the fluorescent substance 2. Therefore, the fluorescent substance is formed as an inclined hexahedron 51 as the second comparative example integrated on a rectangular substance 53 as the first comparative example, and a width of a lower end of the inclined hexahedron 51 is smaller than a width of the rectangular substance 53. The fluorescent substance 2 manufactured according to another embodiment of the present disclosure also has high straightness of light and strong durability like the fluorescent substance 2 manufactured according to the previous embodiment.

According to the present disclosure, it is possible to manufacture a small and smooth fluorescent substance having good durability and high straightness of light.

Although embodiments of the present disclosure have been described above, those skilled in the art may variously modify and change the present disclosure by the addition, change, or deletion, of components without departing from the spirit of the present disclosure described in the appended claims, which will also be included in the scope of the present disclosure.

What is claimed is:

1. A method of manufacturing a fluorescent substance, comprising:
    forming dicing trenches on a top surface of a fluorescent substance wafer along lattice-shaped dicing lines;
    grinding the top surface, on which the dicing trenches are formed, as much as a uniform thickness to remove chipping portion formed on the top surface of the wafer in the forming of the diving trenches;
    filling a bonding material having fluidity in the dicing trenches,
    hardening the bonding material;
    a lower surface grinding operation of grinding a bottom surface opposite to the top surface of the wafer in which the dicing trenches are formed as much as a predetermined thickness using a disk-shaped grinder so that the wafer is divided into a plurality of fluorescent substances which are color conversion members for light emitting diodes (LEDs); and
    removing the bonding material so that only the divided individual fluorescent substances remain,
    wherein the forming of the dicing trenches includes:
    a primary cutting operation of forming a side surface of each of the dicing trenches to be inclined and reduced in width inward using a bevel-type dicing blade whose width is reduced outward; and
    a secondary cutting operation of additionally forming a deeper dicing trench in a bottom surface of each of the dicing trenches formed by the primary cutting operation using a dicing blade having a planar surface with a uniform width,
    wherein the lower surface grinding operation is an operation of reducing a thickness of the bottom surface opposite to the top surface in which the dicing trenches are formed so that the individual fluorescent substances divided along the dicing lines are integrated only by the hardened bond material,
    wherein a width of the planar dicing blade used for the secondary cutting is smaller than a width of an outermost portion of the bevel-type diving blade used for the primary cutting, and
    the dicing trench is formed to be inclined to have a gradually smaller width from the top surface of the wafer to a first depth, and is formed to have a second width, the second width being smaller than a first width formed at the first depth by the bevel-type dicing blade and being uniformly formed by the planar dicing blade from the first depth to a next second depth, and
    wherein the individual fluorescent substance acquired by the removing of the bonding material includes:
    an inclined portion formed at a side of the individual fluorescent substance; and
    a step portion continuously formed from the inclined portion at the side of the individual florescent substance.

2. The method of claim 1, wherein the bonding material is a wax,
    in the filling of the bonding material, the dicing trenches are filled with the wax heated to have fluidity,
    in the hardening, the wax is placed at room temperature for a predetermined time, and
    in the removing of the bonding material, the bonding material is melted by applying a solvent to the bonding material.

3. The method of claim 1, wherein the bonding material is a ultraviolet (UV) curable bonding material, and
    in the hardening operation, UV rays are applied to the bonding material.

4. The method of claim 1, wherein the bonding material is a synthetic resin,
    in the filling of the bonding material, the dicing trenches are filled with a synthetic resin heated to have fluidity,
    in the hardening, the synthetic resin is placed at room temperature for a predetermined time, and
    in the removing of the bonding material, the bonding material is melted by applying isopropyl alcohol to the bonding material.

5. The method of claim 1, wherein the inclined portion is formed from a top portion of the individual fluorescent substance and the step portion is formed from the inclined portion to a bottom portion of the individual fluorescent substance.

6. The method of claim 1, wherein the inclined portion has a width gradually increasing outward and the step portion extends outward at the side of the individual fluorescent substance.

7. The method of claim 1, wherein the inclined portion includes an outwardly inclined surface extending from a top surface of the individual fluorescent substance, and
    the step portion includes:

a horizontal surface connected to an end of the outwardly inclined surface of the inclined portion and horizontally extending outward from the end of the inclined surface; and a vertical surface connected to an end of the horizontal surface and vertically extending from the end of the horizontal surface to a bottom surface of the individual fluorescent substance.

8. The method of claim 1, wherein the individual fluorescent substance includes:

a first portion installed on a light emitting surface of the LED to receive light from the light emitting surface; and a second portion configured to convert colors of the received light and to emit the converted light, the second portion including the side of the individual fluorescent substance.

9. The method of claim 1, wherein the inclined portion and the step portion of the individual fluorescent substance are formed by the primary and secondary cuttings.

* * * * *